United States Patent
Chakraborty et al.

(10) Patent No.: US 7,511,535 B2
(45) Date of Patent: Mar. 31, 2009

(54) FINE-GRAINED POWER MANAGEMENT OF SYNCHRONOUS AND ASYNCHRONOUS DATAPATH CIRCUITS

(75) Inventors: Kanad Chakraborty, Bridgewater, NJ (US); Steven E. Strauss, Orefield, NJ (US); Bingxiong Xu, Edison, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 11/680,225

(22) Filed: Feb. 28, 2007

(65) Prior Publication Data

US 2008/0204124 A1   Aug. 28, 2008

(51) Int. Cl.
*H03K 19/00* (2006.01)

(52) U.S. Cl. .............................. 326/93; 326/33; 326/35; 713/320; 327/544

(58) Field of Classification Search .................. 326/93, 326/95, 98; 365/226–229; 713/320
See application file for complete search history.

(56) References Cited

U.S. PATENT DOCUMENTS

| | | | |
|---|---|---|---|
| 6,140,836 A * | 10/2000 | Fujii et al. | 326/35 |
| 6,320,418 B1 * | 11/2001 | Fujii et al. | 326/93 |
| 6,907,534 B2 | 6/2005 | Ku | |
| 6,946,869 B2 * | 9/2005 | Jacobson et al. | 326/33 |
| 7,157,934 B2 * | 1/2007 | Teifel et al. | 326/38 |

* cited by examiner

*Primary Examiner*—Vibol Tan
(74) *Attorney, Agent, or Firm*—Ryan, Mason & Lewis, LLP

(57) ABSTRACT

A power management circuit is provided for controlling power dissipation in at least one combinational logic circuit. The power management circuit includes a detector operative to receive at least a first input signal to the combinational logic circuit and to detect a transition of the first input signal between a first logic state and a second logic state. The detector generates a control signal indicative of whether or not a transition of the first input signal has occurred. The power management circuit further includes a controller operative to receive the first control signal generated by the detector and to selectively disconnect the first combinational logic circuit from a power supply to the first combinational logic circuit when no logic transition of the first input signal is detected between a preceding computational cycle and a present computational cycle of the first combinational logic circuit, and to connect the first combinational logic circuit to the power supply when a logic transition of the first input signal is detected.

19 Claims, 5 Drawing Sheets

FINE-GRAINED POWER MANAGEMENT OF SYNCHRONOUS AND ASYNCHRONOUS DATAPATH CIRCUITS

FIELD OF THE INVENTION

The present invention relates generally to integrated circuit (IC) power management, and more particularly relates to power management of logic circuits.

BACKGROUND OF THE INVENTION

Power management in integrated circuits is becoming increasingly more important, particularly in power-intensive 65 nanometer (nm) and smaller IC fabrication process technologies. In order to reduce overall power consumption in the IC, it is known to place one or more logic circuits in the IC into a "Power-down" (e.g., Sleep or Standby) mode when they are not being used. For example, multiple-threshold complementary metal-oxide-semiconductor (MTCMOS) devices use high-threshold voltage (VT), low-leakage header and/or footer switches to control leakage power dissipation.

FIG. 1 illustrates a first circuit 102 including a low-VT logic circuit 104 which is selectively connected to a corresponding power supply, VDD, via a high-VT, low-leakage PMOS device 106 functioning as a header switch. PMOS device 106 receives a control signal, SLEEP, for selectively isolating the logic circuit 104 from VDD, such as in a power-down mode of operation, in order to reduce leakage power dissipation in the circuit 102. Likewise, in a second circuit 108, low-VT logic circuit 104 is connected to ground via a high-VT, low-leakage NMOS device 110 functioning as a footer switch. NMOS device 110 receives a control signal, SLEEPN, for selectively isolating the logic circuit 104 from ground, such as in a power-down mode of operation, thereby reducing leakage power dissipation in the circuit 108.

Conventional techniques for managing power in the IC generally rely on a software-based or system-level approach to generate the SLEEP of SLEEPN control signals, using a Power Management Unit (PMU) that receives instructions from a processor (e.g., Advanced RISC Machine (ARM) core). Unfortunately, these conventional approaches can significantly increase software complexity and/or cause non-optimal control signal generation. In particular, by controlling the power management function at the system level (i.e., coarse-grained control), the aforementioned approaches may cause the circuit to be powered-up longer than necessary, resulting in less of a reduction in power dissipation what would otherwise be optimally attainable.

Accordingly, there exists a need for an improved power management methodology which does not suffer from one or more of the above-noted problems exhibited by conventional power management methodologies.

SUMMARY OF THE INVENTION

The present invention meets the above-noted need by providing, in illustrative embodiments thereof techniques for beneficially reducing power dissipation in a circuit employing combinational logic. Techniques of embodiments of the invention preferably utilize a fine-grained, bit-level approach to on-chip power management which offers significant improvement over standard coarse-grained, system-level power management methodologies.

In accordance with one aspect of the invention, a power management circuit is provided for controlling power dissipation in at least one combinational logic circuit. The power management circuit includes a detector operative to receive at least a first input signal to the combinational logic circuit and to detect a transition of the first input signal between a first logic state and a second logic state. The detector generates a control signal indicative of whether or not a transition of the first input signal has occurred. The power management circuit further includes a controller operative to receive the first control signal generated by the detector and to selectively disconnect the first combinational logic circuit from a power supply to the first combinational logic circuit when no logic transition of the first input signal is detected between a preceding computational cycle and a present computational cycle of the first combinational logic circuit, and to connect the first combinational logic circuit to the power supply when a logic transition of the first input signal is detected. At least a portion of the power management circuit may be implemented in an integrated circuit.

The detector preferably includes memory operative to store a logic state of at least the first input signal to the combinational logic circuit, and a comparator. The comparator includes a first input coupled to the memory and a second input for receiving at least one of the first input signal and a signal representative of the first input signal. The comparator generates the control signal indicative of whether or not a transition of the first input signal occurred.

In accordance with another aspect of the invention, an apparatus includes at least one combinational logic circuit and a power management circuit connected to the combinational logic circuit for controlling power dissipation in the combinational logic circuit. The power management circuit includes a detector operative to receive at least a first input signal to the combinational logic circuit and to detect a transition of the first input signal between a first logic state and a second logic state. The detector generates a first control signal indicative of whether or not a transition of the first input signal has occurred. The power management circuit further includes a controller operative to receive the first control signal and to selectively disconnect the combinational logic circuit from a power supply to the combinational logic circuit when no logic transition of the first input signal is detected between a preceding computational cycle and a present computational cycle of the combinational logic circuit, and to connect the combinational logic circuit to the power supply when a logic transition of the first input signal is detected.

In accordance with yet another aspect of the invention, a method for controlling power dissipation in at least a first combinational logic circuit includes the steps of: storing a logic state of at least a first input signal presented to the combinational logic circuit during an immediately preceding computational cycle of the first combinational logic circuit; comparing the stored logic state of the first input signal with a present logic state of the first input signal prior to a start of a present computational cycle of the combinational logic circuit; generating at least a first control signal indicative of whether or not a transition of the first input signal has occurred; selectively disconnecting the combinational logic circuit from a power supply to the combinational logic circuit when no logic transition of the first input signal is detected between preceding and present computational cycles of the combinational logic circuit; and connecting the combinational logic circuit to the power supply when a logic transition of the first input signal is detected between preceding and present computational cycles of the combinational logic circuit.

These and other features, objects and advantages of the present invention will become apparent from the following detailed description of illustrative embodiments thereof, which is to be read in connection with the accompanying drawings.

DETAILED DESCRIPTION OF THE INVENTION

The present invention will be described herein in the context of illustrative pipelined circuit architectures. While techniques of the invention may be employed with synchronous and/or asynchronous pipelined circuits, it should be understood that the present invention is not limited to these or any particular circuit arrangements, or to pipelined circuitry in general. Rather, the invention is more generally applicable to techniques for advantageously reducing power dissipation in a circuit including one or more combinational logic blocks. Embodiments of the invention, at least a portion of which may be implemented in an integrated circuit, utilize a fine-grained, bit-level approach to on-chip power management, thereby advantageously reducing power dissipation in a circuit compared to standard power management methodologies which utilize system level (e.g., coarse-grained) control.

Although implementations of the present invention are described herein with specific reference to P-channel metal-oxide-semiconductor (PMOS) and N-channel metal-oxide-semiconductor (NMOS) transistor devices, as may be formed using a complementary metal-oxide-semiconductor (CMOS) fabrication process, it is to be appreciated that the invention is not limited to such transistor devices and/or such a fabrication process, and that other suitable devices, such as, for example, bipolar junction transistors (BJTs), etc., and/or fabrication processes (e.g., bipolar, BiCMOS, etc.), may be similarly employed, as will be understood by those skilled in the art. Moreover, although preferred embodiments of the invention are typically fabricated in a silicon wafer, embodiments of the invention can alternatively be fabricated in wafers comprising other materials, including but not limited to Gallium Arsenide (GaAs), Indium Phosphide (InP), etc.

Figure 1:
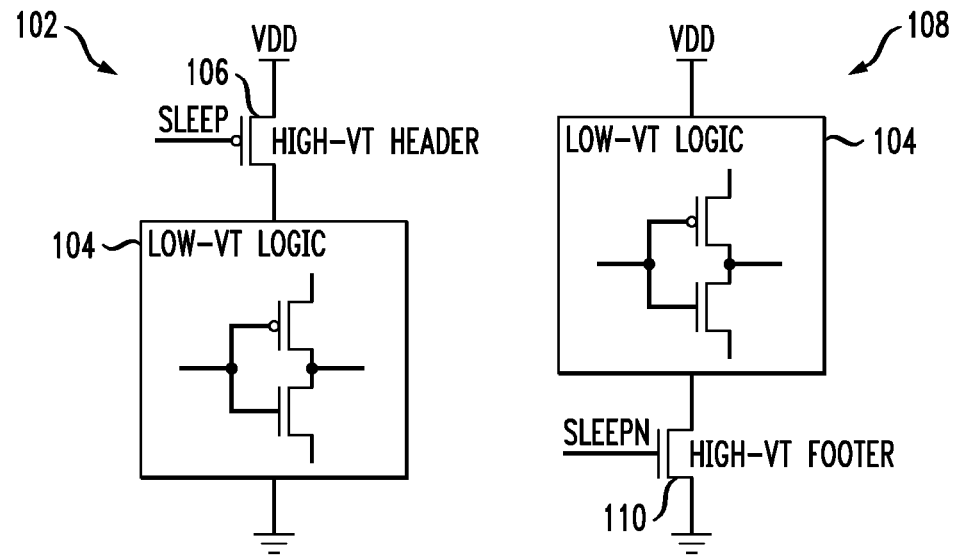
FIG. 1 is a schematic diagram depicting conventional techniques for reducing power dissipation in a given logic circuit.
Figure 2:
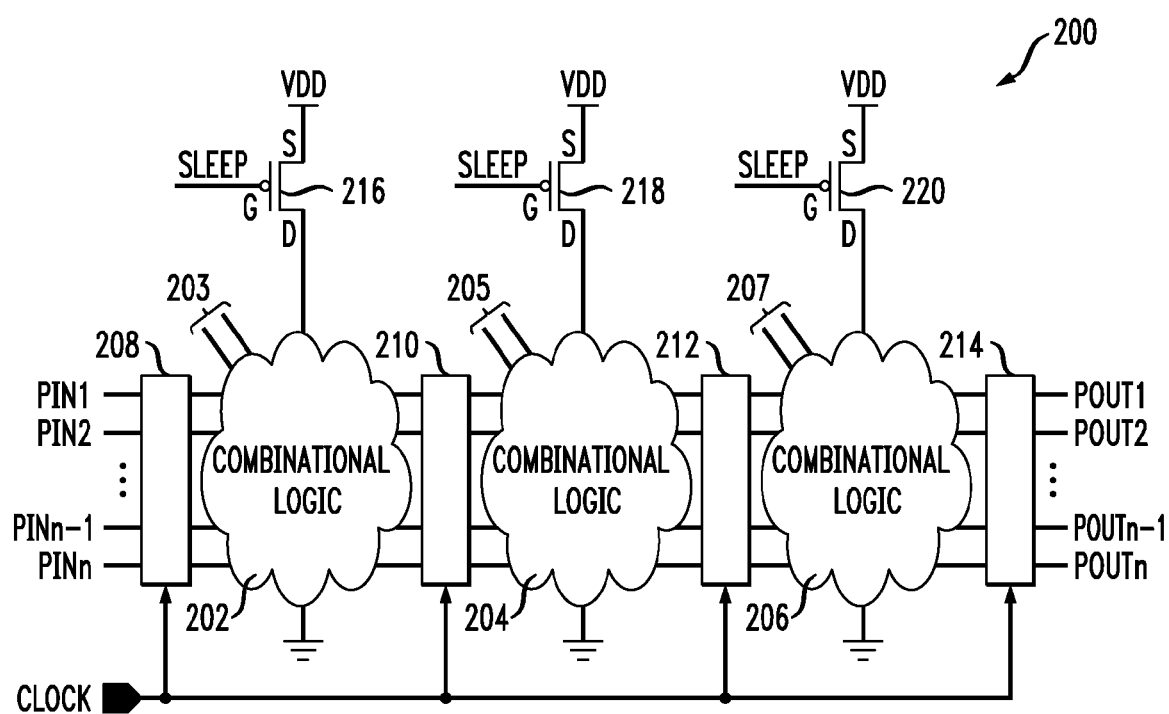
FIG. 2 is a block diagram depicting an exemplary synchronous pipelined circuit in which techniques of the present invention may be implemented.

FIG. 2 is a block diagram depicting an illustrative synchronous pipelined circuit 200 in which techniques of the present invention may be implemented. As shown in the figure, circuit 200 includes first, second and third combinational logic blocks 202, 204 and 206, respectively, connected together such that one or more outputs of a previous logic block are supplied to one or more corresponding inputs of a next subsequent logic block (e.g., pipelined). For example, outputs of logic block 202 are fed to inputs of logic block 204, and outputs of logic block 204 are fed to inputs of logic block 206. Input signals of the pipelined circuit 200, namely, PIN1, PIN2, PINn−1 and PINn, are preferably supplied to corresponding inputs of the first logic block 202, while output signals of the pipelined circuit, namely, POUT1, POUT2, POUTn−1 and POUTn, are preferably generated by corresponding outputs of the third logic block 206. Each logic block 202, 204, 206 may be considered a stage in the pipelined circuit 200. It is to be understood that although three combinational logic blocks are shown, circuit 200 is not limited to any particular number of logic blocks, and that a greater number of logic blocks (e.g., 4) or a smaller number of logic blocks (e.g., 2) may be used. Moreover, the logic blocks 202, 204, 206 are not limited to any particular number of respective inputs and/or outputs.

Each of logic blocks 202, 204 and 206 is preferably connected to a power supply, which may be, for example VDD, via a p-channel metal-oxide-semiconductor (PMOS) transistor device 216, 218 and 220, respectively, and is connected to a current return source, which may be ground. The PMOS devices serve essentially as switches for selectively connecting a corresponding logic block to VDD as a function of a control signal, SLEEP, supplied to the PMOS device. Specifically, PMOS device 216 includes a source (S) connecting to VDD, a drain (D) connected to logic block 202, and a gate for receiving control signal SLEEP. Likewise, PMOS device 218 includes a source connecting to VDD, a drain connected to logic block 204, and a gate for receiving control signal SLEEP, and PMOS device 220 includes a source connecting to VDD, a drain connected to logic block 206, and a gate for receiving control signal SLEEP. It is to be understood that the individual logic blocks 202, 204, 206 need not be connected to the same power supply. When the control signal SLEEP supplied to a given PMOS device is a logic high level (e.g., VDD), the PMOS device will be turned off, thereby effectively disconnecting the logic block corresponding to the PMOS device from its power supply VDD. When SLEEP is a logic low level (e.g., ground), the PMOS device will be turned on, thereby connecting the logic block to VDD.

It is to be appreciated that, because a metal-oxide-semiconductor (MOS) device is symmetrical in nature, and thus bidirectional, the assignment of source and drain designations in the MOS device is essentially arbitrary. Therefore, the source and drain of a given MOS device may be referred to generally as first and second source/drain, respectively, where "source/drain" in this context denotes a source or a drain of the device.

In an alternative embodiment of pipelined circuit 200 (not shown), one or more of the logic blocks may be directly connected to VDD, and may be selectively connected to ground via an n-channel metal-oxide-semiconductor (NMOS) device (not shown) having a source connecting to ground, a drain connected to the corresponding logic block, and a gate for receiving a control signal, which may be a logical complement of control signal SLEEP. The pipelined circuit 200 may utilize one or both of the above-noted techniques for selectively controlling power dissipation in one or more of the logic blocks. In accordance with other embodiments of the invention, a different control signal may be applied to the gate of each of the PMOS devices 216, 218, 220 (and/or NMOS devices, if used). In this manner, power to each of the logic blocks may be independently controlled.

Synchronous pipelined circuit 200 further includes a plurality of registers, 208, 210, 212 and 214 for storing the respective logic states of input and/or output signals of each of the logic blocks in the circuit. To accomplish this, the inputs and outputs of each logic block in pipelined circuit 200 are coupled to respective registers. To reduce the overall number of registers required in the pipelined circuit 200, a given register (e.g., 210) may be shared between two adjacent logic blocks (e.g., 202 and 204), as shown. Specifically, register 208 preferably includes a plurality of inputs operative to receive input signals PIN1, PIN2, PINn−1 and PINn, and a plurality of outputs coupled to corresponding inputs of logic block 202. Register 210 includes a plurality of inputs coupled to outputs of logic block 202 and a plurality of outputs coupled to corresponding inputs of logic block 204. Register 212 includes a plurality of inputs coupled to outputs of logic block 204 and a plurality of outputs coupled to corresponding inputs of logic block 206. Register 214 includes a plurality of inputs coupled to outputs of logic block 206 and a plurality of outputs operative to generate output signals POUT1, POUT2, POUTn−1 and POUTn of the pipelined circuit 200. Outputs of each of the registers 208, 210, 212, 214 are preferably synchronized by a common clock signal, CLOCK. Registers suitable for use with the illustrative synchronous pipelined circuit 200 may include, for example, D-type flip-flops (DFFs), or alternative latch circuitry.

The clock signal CLOCK preferably initiates the start of a computational cycle for each stage in the pipelined circuit 200. The delay of each stage can be multiple cycles of a main system clock. Therefore, the clock signal CLOCK may be generated from the main system clock, for example, by frequency division, or an alternative clock generation methodology.

Embodiments of the present invention advantageously exploit the idea that, in a combinational logic block, when the inputs to the logic block during a given computational cycle, n, remain the same as they were during a preceding computational cycle, n−1, outputs generated by the logic block will also remain unchanged from their logic levels generated during the previous computational cycle. Thus, by monitoring input signals to a given logic block at the start of a computational cycle, a determination can be made as to whether or not the block will be needed during that computational cycle. Accordingly, as long as the outputs generated by the given logic block during the previous computational cycle are stored (e.g., latched), the logic block can be powered down for the duration of the compute cycle. As soon as a change is detected in the logic levels of one or more inputs to the logic block, the logic block can be powered-up again to generate a new set of outputs as a function of the new inputs to the logic block. This bit-oriented methodology, which can be performed for one or more logic blocks in the pipelined circuit 200, represents a fine-grained approach to on-chip power management, one which is capable of producing significant reduction in leakage power dissipation in the chip compared to standard methodologies.

In addition to receiving synchronous inputs, one or more logic blocks may be operative to receive asynchronous inputs. For example, in the illustrative pipelined circuit 200, logic block 202 includes asynchronous inputs 203, logic block 204 includes asynchronous inputs 205, and logic block 206 includes asynchronous inputs 207. Since asynchronous signals are not synchronized to a common clock signal, and therefore cannot be monitored relative to a known computational cycle as in the case of synchronous signals, handshaking signals are preferably monitored to control power to the logic blocks, as will be explained in further detail below. In this instance, when handshaking signals corresponding to a given functional block do not change (e.g., no request signal is issued), it can be assumed that the functional block corresponding thereto will not be needed and can therefore be powered down.

Figure 3:
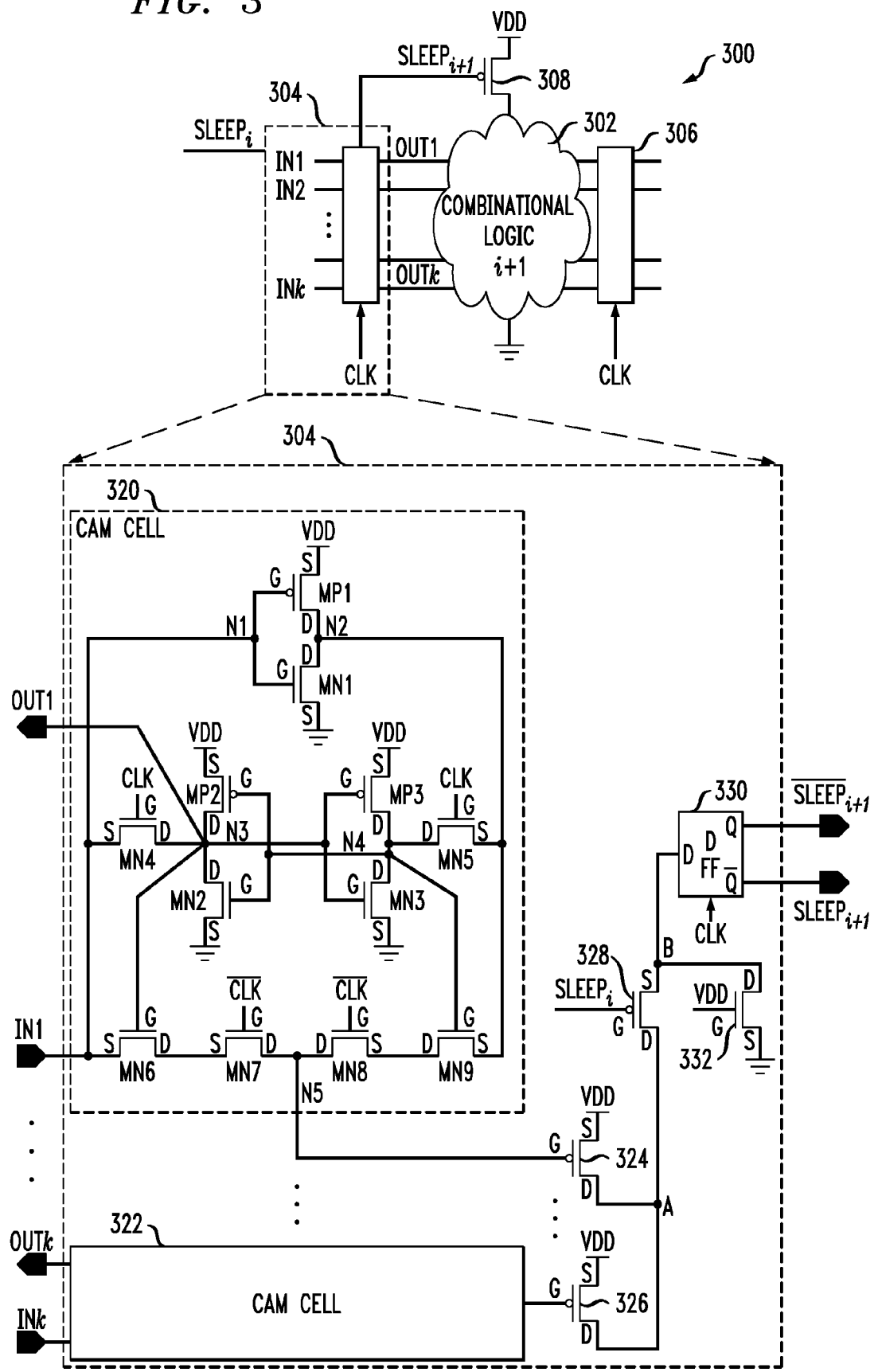
FIG. 3 is a schematic diagram depicting look-ahead SLEEP generation for pipelined sequential circuits, formed in accordance with an embodiment of the present invention.

FIG. 3 is a schematic diagram depicting at least a portion of an exemplary pipelined circuit 300, formed in accordance with an embodiment of the invention. Exemplary circuit 300 includes a combinational logic block 302, a store and compare circuit 304 coupled to inputs of the logic block, and a register 306 coupled to outputs of the logic block. Circuit 300 further includes a PMOS transistor 308 having a source connecting to VDD, or an alternative voltage supply, a drain connected to logic block 302, and a gate for receiving a first control signal, $SLEEP_{i+1}$, generated by store and compare circuit 304. PMOS transistor 308 serves as a controller (e.g., switch) for selectively connecting logic block 302 to VDD as a function of the first control signal. Circuit 300 may represent one of a plurality of stages in a larger synchronous pipelined circuit. In practice, when logic block 302 is coupled to a subsequent combinational logic block (not shown), register 306 may be replaced by a second store and compare circuit similar to store and compare circuit 304.

Store and compare circuit 304 is preferably implemented as a content addressable memory (CAM) cell, as shown. Alternatively, in accordance with other embodiments of the invention, compare circuitry may be added to work in conjunction with existing registers in a synchronous pipelined circuit. Unlike standard computer memory (e.g., random access memory (RAM)) in which the user supplies a memory address and the RAM returns the data word stored at that address, a CAM is designed such that the user supplies a data word and the CAM searches its entire memory to determine if that data word is stored anywhere in the memory. If the data word is found, the CAM returns a list of one or more storage addresses where the word was found (in some architectures, the CAM also returns the data word, or other associated pieces of data). Thus, a CAM is the hardware embodiment of what in software terms would be called an associative array. A CAM is advantageous in that store and compare functionality is integrated in the same cell so that redundant circuitry can essentially be eliminated, thereby resulting in a more area-efficient implementation. This beneficial reduction in chip area becomes even more significant as the number of pipelined stages in the circuit increases.

As shown in expanded view in FIG. 3, store and compare circuit 304 preferably includes a plurality of CAM cells, each CAM cell corresponding to a separate one of the inputs, IN1 through INk, of the circuit, where k is an integer greater than one. Only two CAM cells are shown for clarity, namely, CAM cells 320 and 322, corresponding to inputs IN1 and INk, respectively. CAM cell 320 generates an output OUT1, and CAM cell 322 generates an output OUTk. The details and operation of only one of the CAM cells, 320, will be described herein, although it is to be assumed that in illustrative store and compare circuit 304, CAM cells corresponding to the other inputs (e.g., CAM cell 322) may be formed and operate in a similar manner. Alternative CAM cell arrangements are contemplated by the invention.

CAM cell 320 includes a first inverter comprising PMOS transistor device MP1 and NMOS transistor device MN1. Specifically, a source of MP1 connects to VDD, or an alternative voltage supply of the circuit, a gate of MP1 is connected to a gate of MN1 at node N1 and forms a first input IN1 of the store and compare circuit 304, a drain of MP1 is connected to a drain of MN1 at node N2, and a source of MN1 connects to ground, or an alternative voltage return (e.g., VSS) of the circuit. A logical complement of input IN1 will be generated at an output of the first inverter at node N2. It is to be understood that if a logical complement of an input signal supplied to input IN1 is available, the first inverter may be eliminated. A second inverter comprising PMOS transistor device MP2 and NMOS transistor device MN2, and a third inverter comprising PMOS transistor device MP3 and NMOS transistor device MN3, are connected together in a cross-coupled arrangement to form a storage element of CAM cell 320. Specifically, sources of MP2 and MP3 connect to VDD, gates of MP3 and MN3 are connected together and are connected to drains of MP2 and MN2 at node N3, gates of MP2 and MN2 are connected together and are connected to drains of MP3 and MN3 at node N4, and sources of MN2 and MN3 connect to ground. An output, OUT1, of CAM cell 320 is formed at node N3.

An input signal supplied to input IN1 is fed to node N3 of the storage element via NMOS transistor device MN4, or an alternative pass gate. Likewise, a logical complement of the input signal supplied to input IN1 is fed to node N4 of the storage element via NMOS transistor device MN5, or an alternative pass gate. Specifically, a source of MN4 is connected to input IN1, a drain of MN4 is connected to node N3, a source of MN5 is connected to node N2, a drain of MN5 is connected to node N4, and gates of MN4 and MN5 receive a clock signal CLK supplied to circuit 300. By way of illustration, when a logic low signal is supplied to input IN1, this logic low signal is fed to node N3 through device MN4 when clock signal CLK is a logic high level. Concurrently, a logic high signal will be fed to node N4 through device MN5. When CLK goes to a logic low level, thereby turning off devices MN4 and MN5, the two cross-coupled inverters formed by devices MP2, MP3, MN2 and MN3 will latch the logic states of nodes N3 and N4.

Four additional NMOS transistor devices, namely, devices MN6, MN7, MN8 and MN9, in CAM cell 320 are preferably operative primarily to detect an input bit transition. Specifically, a source of MN6 is connected to input IN1, a drain of MN6 is connected to a source of MN7, a gate of MN6 is connected to the storage element at node N3, drains of MN7 and MN8 are connected together at node N5, a source of MN8 is connected to a drain of MN9, gates of MN7 and MN8 receive a logical complement of the clock signal CLK, a source of MN9 is connected to node N2, and a gate of MN9 is connected to the storage element at node N4. Devices MN6 through MN9 function to detect an input bit transition by comparing a logic level stored in the CAM cell and a logic level of an incoming bit supplied to input IN1 when the clock signal CLK is a logic low level. When a mismatch occurs between the logic state stored in the CAM cell 320 and the logic state of the incoming bit signal at input IN1, CAM cell 320 generates a logic low level output signal at node N5 when clock signal CLK is low. Likewise, when there is no mismatch, the output signal at node N5 will be a logic high level when CLK is low.

Store and compare circuit 304 further includes a DFF 330 and a set of PMOS transistors, 324 and 326, or alternative pull-up devices, corresponding to respective inputs IN1 and INk, which function to set the DFF 330 by supplying a logic high level to an input (D) of the DFF on the next rising edge of the clock signal CLK when at least one of the inputs IN1 and INk has undergone a logic level transition. Specifically, sources of devices 324 and 326 connect to VDD, drains of devices 324 and 326 are connected together at node A, for example, in a wired-OR configuration, a gate of device 324 is connected to node N5 of the CAM cell 320, and a gate of device 326 is connected to a corresponding node in CAM cell 322. When a logic level transition occurs (i.e., a mismatch is detected between the logic state stored in the CAM cell and the logic state of an incoming bit signal supplied to a corresponding input of the CAM cell) in a given CAM cell (e.g., 320), a logic low output signal will be generated by the given CAM cell (at node N5), thereby turning on the corresponding pull-up device (e.g., 324) and pulling up node A to VDD when CLK is low. This causes DFF 330 to generate a logic low level signal $SLEEP_{i+1}$ (since $SLEEP_{i+1}$ is taken from the complementary output of DFF 330) which turns on the next combinational logic stage in the pipelined circuit at the next clock edge.

A PMOS device 328 may be connected between node A and the D input of DFF 330 at node B. Specifically, a drain of device 328 is connected to node A, a source of device 328 is connected to node B, and a gate of device 328 receives control signal $SLEEP_i$ from an immediately preceding stage (stage i) in the pipelined circuit, shuts off the result of the comparison when the present stage, namely, stage i, is powered down (e.g., in sleep mode). Device 328 serves to selectively connect nodes A and B together. If circuit 300 is the first stage in the pipelined circuit, the gate of device 328 may be connected to ground thereby turning on device 328 since there is no previous SLEEP signal to be received. Alternatively, device 328 may be eliminated when there is no preceding stage, so that a direct connection exists between nodes A and B.

When device 328 is turned off as a result of the control signal $SLEEP_i$ from the preceding stage being a logic high level, indicating that the preceding stage is powered down (e.g., in sleep mode), node B will float and therefore the input to DFF 330 will be undefined. In order to avoid this condition, a pull-down element, implemented herein as an NMOS transistor device 332, is included in store and compare circuit 304. Specifically, a source of device connects to ground, a drain of device 332 is connected to the D input of DFF 330 at node B, and a gate of device 332 connects to VDD, or an alternative bias voltage source. With its gate connected directly to VDD, device 332 is always turned on and essentially functions as a resistor. In order to minimize drain current, device 332 is preferably sized having a channel width-to-length (W/L) ratio that is substantially less than one, although the invention is not limited to any particular size for device 332. Alternatively, device 332 may be substituted by a resistor having a suitably high resistance value (e.g., greater than about 100 kilo ohms) to minimize current consumption in the circuit, although an MOS resistor implementation as shown is typically more area efficient.

When no transition is detected by store and compare circuit 304 (i.e., the stored logic states are the same as the respective logic states of the input bits IN1 through INk), pull-up devices 324 and 326 will be turned off thereby allowing node A to float when CLK is low. Pull-down device 332 serves to pull node B to ground (logic low), thereby clearing DFF 330 by supplying a low logic level to the D input of the DFF on the next rising edge of the clock signal CLK. This causes DFF 330 to generate a high logic level control signal $SLEEP_{i+1}$ which turns off the present combinational logic block 302 in stage i+1, for example, in a sleep mode of operation. Likewise, when a transition is detected by store and compare circuit 304, one or more of devices 324 and 326 will be turned on, thereby pulling node A to VDD (logic high). Assuming the preceding stage i is not in a sleep mode, and therefore control signal SLEEPi is low, device 328 will be turned on and node B will be pulled up high against device 332. It is for this reason that device 332 should be made weaker than devices 324 and 326 (e.g., device 332 should have a W/L ratio which is less than a W/L ratio of any of devices 324 and 326), so that any one of devices 324 and 326 can pull up node B to a logic high state.

The circuit 300 of FIG. 3 may be employed for handling synchronous signals supplied to the exemplary pipelined circuit 200 shown in FIG. 2. It is to be understood that for asynchronous signals (e.g., signals 203, 205 and 207 of FIG. 2) which are not latched, a CAM cell, or alternative store and compare circuitry, can be used for each asynchronous input to first latch the asynchronous signal and then perform transition detection in a manner similar to that described above in conjunction with FIG. 3 relating to synchronous signals.

Figure 4:
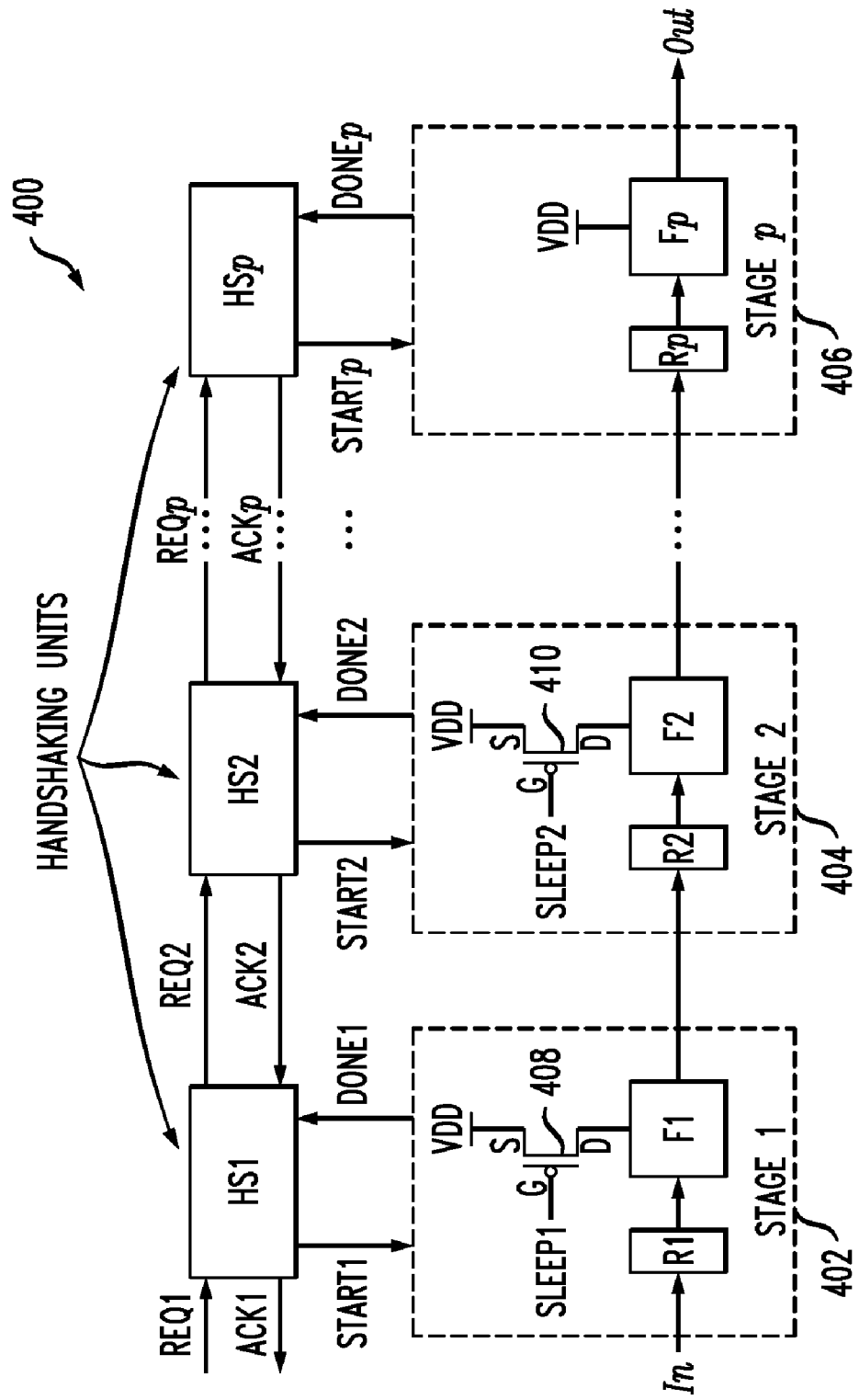
FIG. 4 is a block diagram depicting at least a portion of an exemplary asynchronous, self-timed pipelined circuit, formed in accordance with another embodiment of the present invention.

In the case of asynchronous, self-timed pipelined datapath circuits employing handshaking signals, such as, for example, request REQ, acknowledge ACK, START and DONE, the exemplary pipelined circuit 400 shown in FIG. 4 may be used, in accordance with another embodiment of the invention. In this instance, compare circuitry included in circuit 400 preferably monitors logic level transitions of the handshaking signals rather than transitions of the input data bits to the circuit. As apparent from the figure, circuit 400 preferably includes a plurality of combinational logic stages, namely, 402 (Stage 1), 404 (Stage 2), and 406 (Stage p, where p is an integer greater than 3). Although three pipelined stages are depicted, it is to be understood that the invention is not limited to any particular number of stages, and that a greater number of stages (e.g., 4) or a smaller number of stages (e.g., 2) may be used.

In a multiple-stage embodiment, each stage preferably includes an input register, for storing the logic state of one or more input signals presented to the stage and for detecting a transition between the stored logic signals and incoming logic signals, and a functional block, which may comprise combinational logic circuitry for generating one or more output signals. Register R1 may comprise, for example, a store and compare circuit similar to circuit 304 shown in FIG. 3. The one or more output signals generated by one stage (e.g., 402) may be passed to a subsequent stage (e.g., 404) in the pipelined circuit 400 for further processing, until a final stage 406 is encountered. Specifically, stage 402 includes a first register R1 operative to receive an input signal, In, supplied to the pipelined circuit 400, and a first functional block F1 coupled to register R1; stage 404 includes a second register R2 operative to receive an output signal generated by functional block F1, and a second functional block F2 coupled to register R2; and stage 406 includes a third register Rp operative to receive an output signal generated by functional block F2, and a third functional block Fp coupled to register Rp (where p is an integer greater than two). Functional block Fp is operative to generate an output signal, Out, of the pipelined circuit 400.

Each of the stages, except final stage 406, further includes a PMOS transistor device, or alternative switch (e.g., NMOS device), operative to selectively connect a functional block to its corresponding voltage supply, which may be VDD, as a function of a control signal supplied to the device. For example, stage 402 includes a PMOS device 408 having a source connecting to VDD, a drain connected to functional block F1, and a gate for receiving a first control signal SLEEP1. Likewise, stage 404 includes a PMOS device 410 having a source connecting to VDD, a drain connected to functional block F2, and a gate for receiving a second control signal SLEEP2. Note that the last stage of the pipelined circuit 400 does not include a switch device for selectively connecting its functional block Fp to VDD. Due to the asynchronous nature of this circuit configuration, we do not have control over how and when the output signal Out will be sampled by external circuits. Accordingly, final stage 406 preferably remains turned on and is therefore shown connected directly to VDD. However, by adding an additional output register (not shown), which may be similar to any one of registers R1, R2 or Rp, connected to the output of block Fp, stage 406 can be safely powered down without losing the data generated by block Fp. In this alternative configuration, a PMOS device, or other switching circuitry, is preferably added between block Fp and VDD, and controlled by another control signal (e.g., SLEEPp) in a manner consistent with stages 402 and 404.

Pipelined circuit 400 further includes a plurality of handshaking units, namely, HS1, HS2, and HSp, each handshaking unit corresponding to a respective one of the combinational logic stages 402, 404 and 406. Specifically, handshaking unit HS1 is connected to stage 402 and is operative to receive a request signal REQ1, to generate an acknowledge signal ACK1, to generate a control signal START1 supplied to stage 402, to receive an acknowledgment signal DONE1 from stage 402, to generate a request signal REQ2 supplied to handshaking unit HS2, and to receive an acknowledge signal ACK2 from HS2. Likewise, handshaking unit HS2 is connected to stage 404 and is operative to receive request signal REQ2 generated by HS1, to generate acknowledge signal ACK2 supplied to HS1, to generate a control signal START2 supplied to stage 404, to receive an acknowledgment signal DONE2 from stage 404, to generate a request signal REQp supplied to handshaking unit HSp, and to receive an acknowledge signal ACKp from HSp. Finally, handshaking unit HSp is connected to stage 406 and is operative to receive request signal REQp generated by HS2, to generate acknowledge signal ACKp supplied to HS2, to generate a control signal STARTp supplied to stage 406, and to receive an acknowledgment signal DONEp from stage 406.

Each of the handshaking units HS1, HS2 and HSp may be the same, although since handshaking unit HSp is the final handshaking unit in the pipelined circuit 400, a request signal output is not shown, nor is an acknowledge input signal shown in connection with HSp. In an asynchronous mode of operation, since there is no clock signal to synchronize computations cycles in the pipelined circuit 400, control signals START1, START2, STARTp becoming active (e.g., logic high) initiate the start of respective computational cycles in stages 402, 404, 406, and acknowledgment signals DONE1, DONE2, DONEp signify completion of the respective computational cycles.

Operation of pipelined circuit 400 will now be described, assuming positive edge-triggered logic). When an input word arrives at the input In of circuit 400, a request signal REQ1 is raised to functional block F1. If block F1 is inactive and available at this time, F1 raises an acknowledge signal ACK1 to input register R1. The acknowledge signal ACK1 is also output by handshaking unit HS1. Input register R1 then goes ahead and fetches the next word. Functional block F1 is enabled by the control signal START1 going high. After a certain amount of time depending on the data values, the acknowledgment signal DONE1 goes high indicating the completion of the computation by block F1. At this point, a request signal REQ2 is issued to block F2. If this functional block is available, an acknowledge signal ACK2 is raised by F2 to input register R2 and the data output of block F1 is transferred to register R2. Block F1 can then proceed with its next computation when a new request signal REQ1 to F1 arrives.

In a similar fashion, when control signal START2 goes high, block F2 begins processing the data in register R2 and, when processing has been completed by F2, the acknowledgment signal DONE2 goes high. At this point, a request signal REQp is issued to block Fp. If functional block Fp is available, an acknowledge signal ACKp is raised by Fp to input register Rp and the data output of block F2 is transferred to register Rp. Block F2 can then proceed with its next computation when a new request signal REQ2 to F2 arrives. When control signal STARTp goes high, block Fp begins processing the data in register Rp and, when processing has been completed by Fp, the acknowledgment signal DONEp goes high. At this point, the results of functional block Fp are available at the output Out of pipelined circuit 400 for sampling by an external circuit.

Figure 5A:
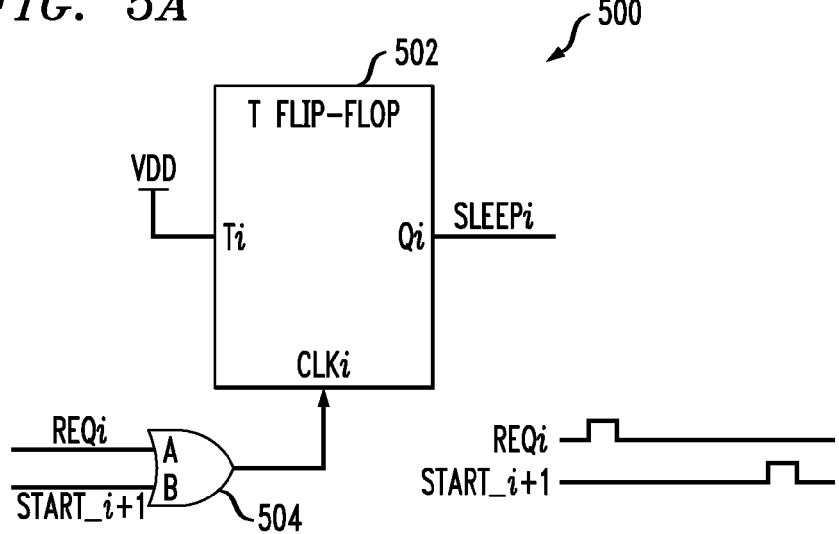
FIGS. 5A and 5B are schematic diagrams depicting exemplary circuits for generating a control signal for powering down a corresponding functional block in the pipelined circuit of FIG. 4, in accordance with embodiments of the present invention.
Figure 5B:
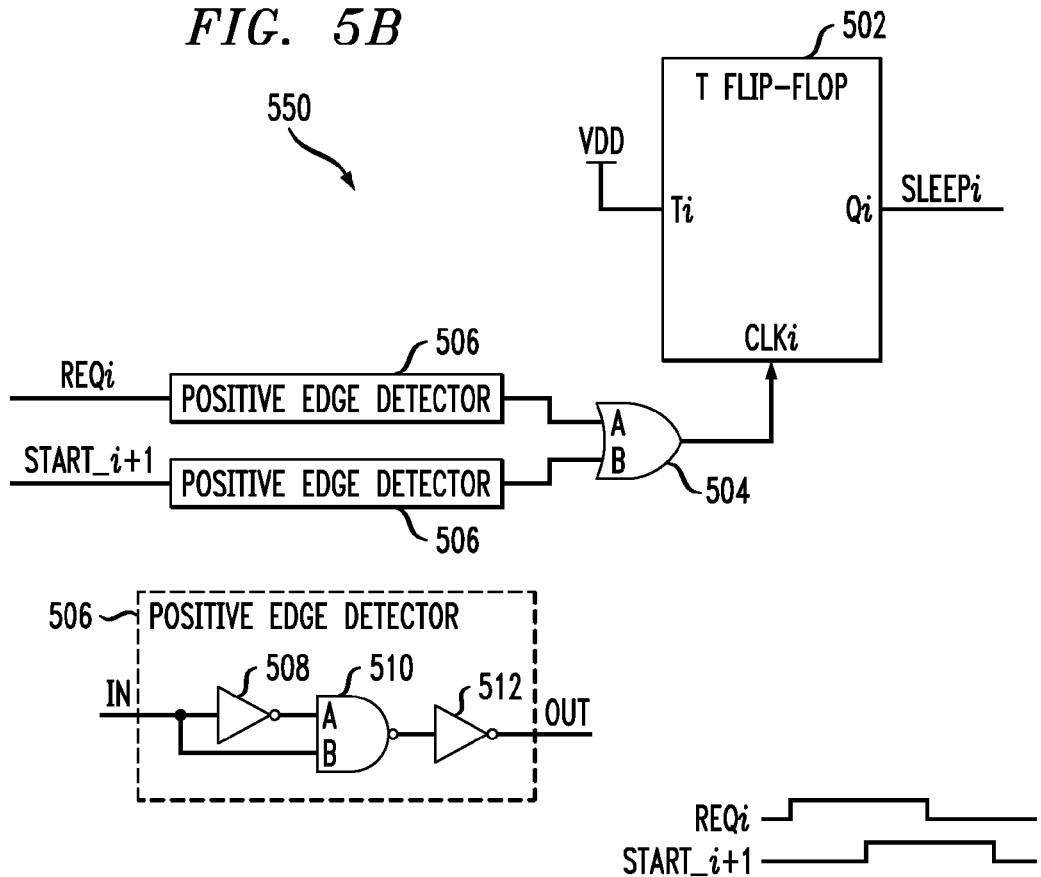

FIGS. 5A and 5B are schematic diagrams depicting exemplary circuits 500 and 550, respectively, for generating control signal SLEEPi, where i is an integer corresponding to a given one of the stages in an asynchronous pipelined circuit (e.g., 400 shown in FIG. 4), in accordance with embodiments of the invention. The two circuits are essentially the same except that circuit 500 shown in FIG. 5A is employed when the request signal REQi and control signal STARTi are non-overlapping relative to one another, and circuit 550 is employed when signals REQi and STARTi overlap one another.

Specifically, with reference to FIG. 5A, circuit 500 for generating control signal SLEEPi includes a toggle (T) flip-flop 502 having a data input (Ti) connecting to VDD, or an alternative logic high level source, a clock input (CLKi) for a receiving a clock signal, and an output (Qi) for generating control signal SLEEPi. The clock signal is preferably generated by a logical OR gate 504 having a first input (A) for receiving request signal REQi, a second input (B) for receiving control signal START_i+1, and an output for generating the clock signal supplied to the clock input CLKi of flip-flop 502. There are various ways of designing the handshaking units HS1 through HSp shown in FIG. 4, as will become apparent to those skilled in the art. An intermediate functional block, Fi, (where i is an integer representing one of the stages in the pipeline) in pipelined circuit 400 of FIG. 4, should be kept powered on (i.e., "awake"), such as by keeping corresponding control signal SLEEPi low, for the entire duration of time from the start of a request signal, REQi, made to functional block Fi to the time the resultant data generated by functional block Fi is fetched by a next subsequent register, R_i+1, in the pipeline. Since there are essentially no clocks in the circuit, as this is an asynchronous circuit, register R_i+1 fetches data from functional block Fi only on demand after it receives a control signal START_i+1.

In FIGS. 5A and 5B, control signal SLEEPi generated by flip-flop 502 is initially high, which turns off corresponding functional block Fi. With the arrival of request signal REQi, control signal SLEEPi goes low and turns on functional block Fi. With the issuance of control signal START_i+1, the current processing task performed in logic block Fi is completed, so control signal SLEEPi goes high again and functional block Fi goes into sleep mode.

With reference to FIG. 5B, when signals REQi and START_i+1 overlap one another, a positive edge detection circuit 506, or alternative edge detection circuitry, may be added to one or both inputs of OR gate 504. Positive edge circuit 506 preferably includes a first inverter 508 having an input for receiving an input signal, In, which may be signal REQi or signal START_i+1 and an output connected to a first input (A) of a NAND gate 510. Input signal In is supplied directly to a second input (B) of NAND gate 510. An output of NAND gate 510 is connected to a second inverter 512 which generates an output signal, Out, which is a logical complement of the output signal generated by NAND gate 510. Circuit 506 generates an output pulse having a rising edge substantially aligned to a rising edge of signal In, and having a pulse width that is substantially equal to a propagation delay of first inverter 508. Thus, the pulse width of signal Out can be selectively adjusted as desired by controlling the delay of inverter 508. In other embodiments, additional inverters and/or one or more delay elements may be added in series with or in place of inverter 508 to increase the delay in the signal path to input A of NAND gate 510, as will become apparent to those skilled in the art.

Figure 6:
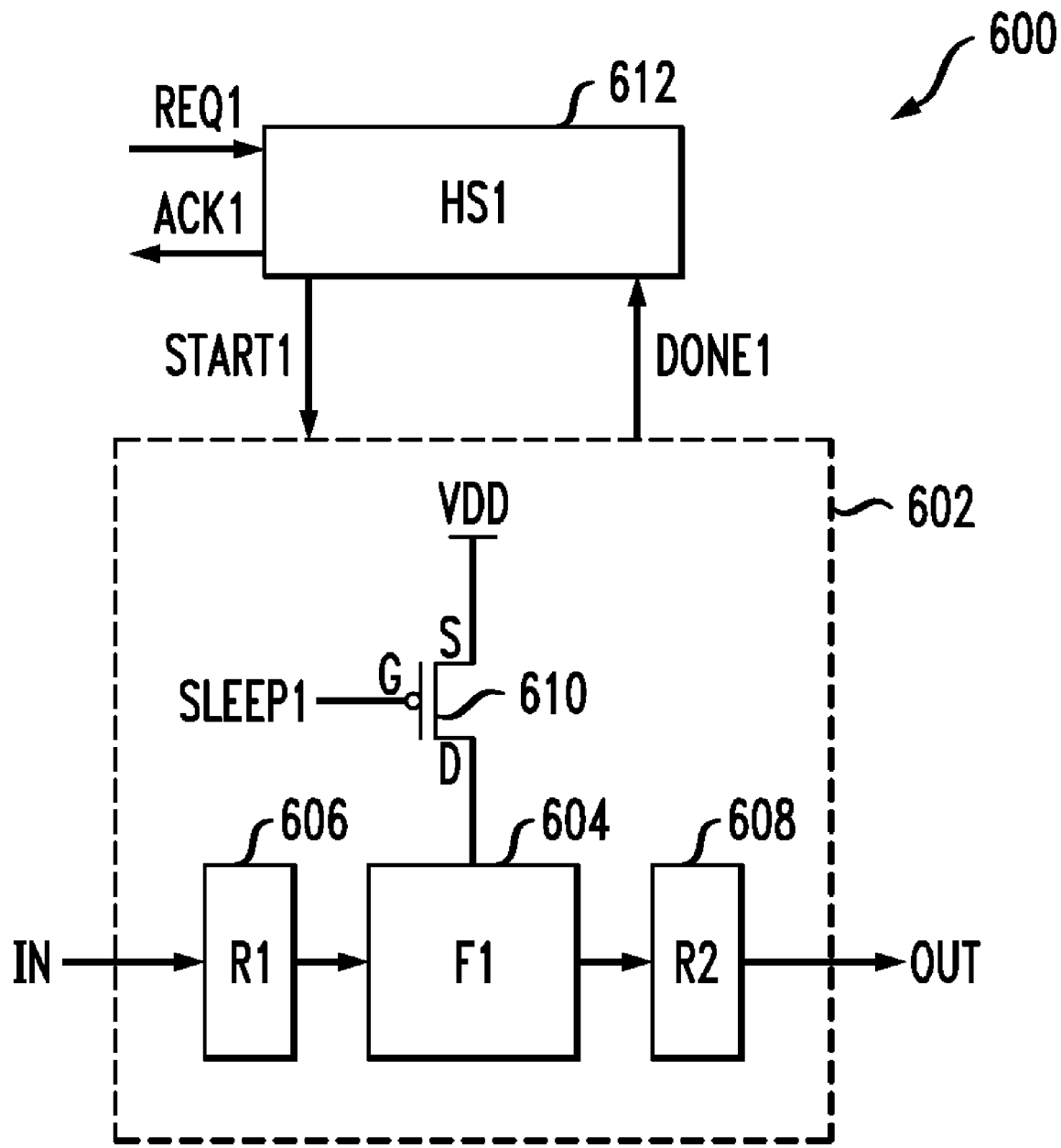
FIG. 6 is a block diagram depicting at least a portion of an exemplary asynchronous circuit having a single combinational logic stage, formed in accordance with an embodiment of the present invention.

FIG. 6 is a block diagram depicting at least a portion of an exemplary asynchronous circuit 600 having a single combinational logic stage 602 (e.g., not pipelined), formed in accordance with an embodiment of the present invention. For the illustrative pipelined circuit 400 shown in FIG. 4, wherein multiple combinational logic stages were employed, each stage except for the last stage included a functional block connected to an input register. In circuit 600, stage 602 preferably includes a functional block (F1) 604 and both an input register (R1) 606 and an output register (R2) 608 connected to the functional block. Circuit 600 further includes a PMOS transistor device 610, or an alternative switch circuit, having a source connected to VDD, a drain connected to functional block 604, and a gate for receiving a control signal SLEEP1. A handshaking unit (HS1) 612 connected to stage 602 generates and/or receives the appropriate handshaking signals (e.g., REQ1, ACK1, START1, DONE1) for interfacing stage 602 with external circuitry.

At least a portion of the power management techniques of the present invention may be implemented in an integrated circuit. In forming integrated circuits, die are typically fabricated in a repeated pattern on a surface of a semiconductor wafer. Each of the die includes a device described herein, and may include other structures or circuits. Individual die are cut or diced from the wafer, then packaged as integrated circuits. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A power management circuit for controlling power dissipation in at least a first combinational logic circuit, the power management circuit comprising:

a detector operative to receive at least a first input signal to the first combinational logic circuit and to detect a transition of the first input signal between a first logic state and a second logic state, the detector generating a first control signal indicative of whether or not a transition of the first input signal has occurred; and a controller operative to receive the first control signal generated by the detector and to selectively disconnect the first combinational logic circuit from a power supply to the first combinational logic circuit when no logic transition of the first input signal is detected between a preceding computational cycle and a present computational cycle of the first combinational logic circuit, and to connect the first combinational logic circuit to the power supply when a logic transition of the first input signal is detected between preceding and present computational cycles of the first combinational logic circuit;

wherein the detector comprises:

memory operative to store a logic state of at least the first input signal to the first combinational logic circuit during at least a portion of a computational cycle of the first combinational logic circuit; and a comparator including a first input coupled to the memory and a second input for receiving at least one of the first input signal and a signal representative of the first input signal, the comparator generating the first control signal indicative of whether or not a transition of the first input signal has occurred.

2. A power management circuit for controlling power dissipation in at least a first combinational logic circuit, the power management circuit comprising:

a detector operative to receive at least a first input signal to the first combinational logic circuit and to detect a transition of the first input signal between a first logic state and a second logic state, the detector generating a first control signal indicative of whether or not a transition of the first input signal has occurred; and a controller operative to receive the first control signal generated by the detector and to selectively disconnect the first combinational logic circuit from a power supply to the first combinational logic circuit when no logic transition of the first input signal is detected between a preceding computational cycle and a present computational cycle of the first combinational logic circuit, and to connect the first combinational logic circuit to the power supply when a logic transition of the first input signal is detected between preceding and present computational cycles of the first combinational logic circuit;

wherein the detector comprises:

a content-addressable memory operative to store a logic state of the first input signal during at least a portion of a previous computational cycle of the first combinational logic circuit and to compare the stored logic state of the first input signal with a logic state of the first input signal during at least a portion of a present computational cycle of the first combinational logic circuit, the content-addressable memory generating a comparison signal indicative of whether or not a logic state transition of the first input signal has occurred.

3. The power management circuit of claim 2, wherein the content-addressable memory comprises:

a storage element;

first and second pass gates connected to the storage element, the first pass gate being operative to selectively couple an input of the content-addressable memory to a first node of the storage element as a function of a second control signal, the second pass gate being operative to selectively couple a logical complement of the input of the content-addressable memory to a second node of the storage element as a function of the second control signal;

first, second, third and fourth metal-oxide-semiconductor (MOS) devices, a first source/drain of the first MOS device being connected to the input of the content-addressable memory, a second source/drain of the first MOS device being connected to a first source/drain of the second MOS device, a gate of the first MOS device being connected to the first node of the storage element, a second source/drain of the second MOS device being connected to a first source/drain of the third MOS device and forming an output of the content-addressable memory, a second source/drain of the third MOS device being connected to a first source/drain of the fourth MOS device, gates of the second and third MOS devices receiving the second control signal, a second source/drain of the fourth MOS device being connected to the complement of the input of the content-addressable memory, and a gate of the fourth MOS device being connected to the second node of the storage element, the comparison signal being generated at the output of the content-addressable memory.

4. A power management circuit for controlling power dissipation in at least a first combinational logic circuit, the power management circuit comprising:

a detector operative to receive at least a first input signal to the first combinational logic circuit and to detect a transition of the first input signal between a first logic state and a second logic state, the detector generating a first control signal indicative of whether or not a transition of the first input signal has occurred; and a controller operative to receive the first control signal generated by the detector and to selectively disconnect the first combinational logic circuit from a power supply to the first combinational logic circuit when no logic transition of the first input signal is detected between a preceding computational cycle and a present computational cycle of the first combinational logic circuit, and to connect the first combinational logic circuit to the power supply when a logic transition of the first input signal is detected between preceding and present computational cycles of the first combinational logic circuit;

wherein the first combinational logic circuit includes a plurality of inputs for receiving respective input signals supplied to the first combinational logic circuit, the detector comprising a plurality of respective content-addressable memory cells coupled to corresponding inputs of the first combinational logic circuit, each of the content-addressable memory cells being operative to store a previous logic state of a corresponding one of the input signals and to compare the stored previous logic state of the input signal with a present logic state of the input signal, the detector generating the first control signal indicative of whether or not a logic state transition of at least one of the input signals has occurred as a function of results of the respective comparisons.

5. The power management circuit of claim 1, wherein the power management circuit is operative to control power dissipation in a plurality of combinational logic circuits, the combinational logic circuits being arranged in a synchronous pipelined configuration, such that an output signal generated by one combinational logic circuit is supplied to an input of a next subsequent combinational logic circuit.

6. The power management circuit of claim 1, wherein the power management circuit is operative to control power dissipation in a plurality of combinational logic circuits, the combinational logic circuits being arranged in an asynchronous pipelined configuration.

7. The power management circuit of claim 6, wherein the detector is operative to detect a logic state transition of at least one handshaking signal corresponding to at least a given one of the plurality of combinational logic circuits during at least a portion of a computational cycle of the given combinational logic circuit.

8. The power management circuit of claim 7, wherein the at least one handshaking signal comprises at least one a request signal (REQ) and an acknowledge signal (ACK).

9. The power management circuit of claim 1, wherein the controller comprises at least one metal-oxide-semiconductor device having a first source/drain connecting to a voltage supply of the combinational logic circuit, a second source/drain connected to the first combination logic circuit, and a gate for receiving the first control signal generated by the detector.

10. A power management circuit for controlling power dissipation in at least a first combinational logic circuit, the power management circuit comprising:

a detector operative to receive at least a first input signal to the first combinational logic circuit and to detect a transition of the first input signal between a first logic state and a second logic state, the detector generating a first control signal indicative of whether or not a transition of the first input signal has occurred; and a controller operative to receive the first control signal generated by the detector and to selectively disconnect the first combinational logic circuit from a power supply to the first combinational logic circuit when no logic transition of the first input signal is detected between a preceding computational cycle and a present computational cycle of the first combinational logic circuit, and to connect the first combinational logic circuit to the power supply when a logic transition of the first input signal is detected between preceding and present computational cycles of the first combinational logic circuit;

wherein the detector comprises:

at least one content-addressable memory connected between the first combinational logic circuit and a first input to the first combinational logic circuit, the content-addressable memory being operative to store a logic state of the first input signal received at the first input during at least a portion of a previous computational cycle of the first combinational logic circuit and to compare the stored logic state of the first input signal with a logic state of the first input signal during at least a portion of a present computational cycle of the first combinational logic circuit, the content-addressable memory generating the first control signal indicative of whether or not a logic state transition of the first input signal has occurred as a function of a result of the comparison;

a flip-flop having an output for generating the first control signal, a clock input for receiving a clock signal, and a data input; and a pull-up device having a first terminal connecting to a voltage supply of the first combinational logic circuit, a second terminal coupled to the data input of the flip-flop, and a control input connected to an output of the content-addressable memory, the pull-up device being operative to set the flip-flop to a logic high state on a next rising edge of the clock signal when the first input signal has undergone a logic level transition during an immediately preceding clock cycle.

11. The power management circuit of claim 10, wherein the detector further comprises a metal-oxide-semiconductor device having a first source/drain connected to the second terminal of the pull-up device, a second source/drain connected to the data input of the flip-flop, and a gate for receiving a second control signal, the second control signal being generated by a detector corresponding to a second combinational logic circuit immediately preceding the first combinational logic circuit.

12. An apparatus, comprising:

at least one combinational logic circuit; and a power management circuit connected to the at least one combinational logic circuit for controlling power dissipation in the combinational logic circuit, the power management circuit comprising:

a detector operative to receive at least a first input signal to the combinational logic circuit and to detect a transition of the first input signal between a first logic state and a second logic state, the detector generating a first control signal indicative of whether or not a transition of the first input signal has occurred; and a controller operative to receive the first control signal generated by the detector and to selectively disconnect the first combinational logic circuit from a power supply to the first combinational logic circuit when no logic transition of the first input signal is detected between a preceding computational cycle and a present computational cycle of the first combinational logic circuit, and to connect the first combinational logic circuit to the power supply when a logic transition of the first input signal is detected between preceding and present computational cycles of the first combinational logic circuit;

wherein the detector comprises:

memory operative to store a logic state of at least the first input signal to the combinational logic circuit during at least a portion of a computational cycle of the combinational logic circuit; and a comparator including a first input coupled to the memory and a second input for receiving at least one of the first input signal and a signal representative of the first input signal, the comparator generating the first control signal indicative of whether or not a transition of the first input signal has occurred.

13. An apparatus, comprising:

at least one combinational logic circuit; and a power management circuit connected to the at least one combinational logic circuit for controlling power dissipation in the combinational logic circuit, the power management circuit comprising:

a detector operative to receive at least a first input signal to the combinational logic circuit and to detect a transition of the first input signal between a first logic state and a second logic state, the detector generating a first control signal indicative of whether or not a transition of the first input signal has occurred; and a controller operative to receive the first control signal generated by the detector and to selectively disconnect the first combinational logic circuit from a power supply to the first combinational logic circuit when no logic transition of the first input signal is detected between a preceding computational cycle and a present computational cycle of the first combinational logic circuit, and to connect the first combinational logic circuit to the power supply when a logic transition of the first input signal is detected between preceding and present computational cycles of the first combinational logic circuit;

wherein the at least one combinational logic circuit comprises:

a functional logic block;

a first register connected to at least one input of the functional logic block, the first register being operative to store a logic state of at least one input signal supplied to the at least one input of the functional logic block during at least a portion of a computational cycle of the functional logic block; and a second register connected to at least one output of the functional logic block, the second register being operative to store a logic state of at least one output signal generated by the functional logic block during at least a portion of the computational cycle of the functional logic block.

14. The apparatus of claim 13, wherein the first register comprises a content-addressable memory operative to store a logic state of the first input signal during at least a portion of a previous computational cycle of the first combinational logic circuit and to compare the stored logic state of the first input signal with a logic state of the first input signal during at least a portion of a present computational cycle of the first combinational logic circuit, the content-addressable memory generating a comparison signal indicative of whether or not a logic state transition of the first input signal has occurred.

15. An apparatus, comprising:
at least one combinational logic circuit; and
a power management circuit connected to the at least one combinational logic circuit for controlling power dissipation in the combinational logic circuit, the power management circuit comprising:
a detector operative to receive at least a first input signal to the combinational logic circuit and to detect a transition of the first input signal between a first logic state and a second logic state, the detector generating a first control signal indicative of whether or not a transition of the first input signal has occurred; and
a controller operative to receive the first control signal generated by the detector and to selectively disconnect the first combinational logic circuit from a power supply to the first combinational logic circuit when no logic transition of the first input signal is detected between a preceding computational cycle and a present computational cycle of the first combinational logic circuit, and to connect the first combinational logic circuit to the power supply when a logic transition of the first input signal is detected between preceding and present computational cycles of the first combinational logic circuit;
wherein the detector comprises:
a content-addressable memory operative to store a logic state of the first input signal during at least a portion of a previous computational cycle of the combinational logic circuit and to compare the stored logic state of the first input signal with a logic state of the first input signal during at least a portion of a present computational cycle of the combinational logic circuit, the content-addressable memory generating a comparison signal indicative of whether or not a logic state transition of the first input signal has occurred.

16. The apparatus of claim 12, wherein the apparatus comprises a plurality of combinational logic circuits, and the power management circuit is operative to control power dissipation in the plurality of combinational logic circuits, the combinational logic circuits being arranged in an asynchronous pipelined configuration, the detector being operative to detect a logic state transition of at least one handshaking signal corresponding to at least a given one of the plurality of combinational logic circuits during at least a portion of a computational cycle of the given combinational logic circuit.

17. The apparatus of claim 12, wherein the controller comprises at least one metal-oxide-semiconductor device having a first source/drain connecting to a voltage supply of the combinational logic circuit, a second source/drain connected to the first combination logic circuit, and a gate for receiving the first control signal generated by the detector.

18. A method for controlling power dissipation in at least a first combinational logic circuit, the method comprising the steps of:

storing a logic state of at least a first input signal presented to the first combinational logic circuit during an immediately preceding computational cycle of the first combinational logic circuit;
comparing the stored logic state of the first input signal with a present logic state of the first input signal prior to a start of a present computational cycle of the first combinational logic circuit, the computational cycles of the at least first combinational logic circuit being synchronized by a common clock signal;
generating at least a first control signal indicative of whether or not a transition of the first input signal has occurred;
selectively disconnecting the first combinational logic circuit from a power supply to the first combinational logic circuit when no logic transition of the first input signal is detected between preceding and present computational cycles of the first combinational logic circuit; and
connecting the first combinational logic circuit to the power supply when a logic transition of the first input signal is detected between preceding and present computational cycles of the first combinational logic circuit.

19. An integrated circuit including at least one power management circuit for controlling power dissipation in at least a first combinational logic circuit, the power management circuit comprising:
a detector operative to receive at least a first input signal to the first combinational logic circuit and to detect a transition of the first input signal between a first logic state and a second logic state, the detector generating a first control signal indicative of whether or not a transition of the first input signal has occurred; and
a controller operative to receive the first control signal generated by the detector and to selectively disconnect the first combinational logic circuit from a power supply to the first combinational logic circuit when no logic transition of the first input signal is detected between a preceding computational cycle and a present computational cycle of the first combinational logic circuit, and to connect the first combinational logic circuit to the power supply when a logic transition of the first input signal is detected between preceding and present computational cycles of the first combinational logic circuit;
wherein the detector comprises:
memory operative to store a logic state of at least the first input signal to the first combinational logic circuit during at least a portion of a computational cycle of the first combinational logic circuit; and
a comparator including a first input coupled to the memory and a second input for receiving at least one of the first input signal and a signal representative of the first input signal, the comparator generating the first control signal indicative of whether or not a transition of the first input signal has occurred.

* * * * *